US010960716B2

(12) United States Patent
Xie et al.

(10) Patent No.: US 10,960,716 B2
(45) Date of Patent: Mar. 30, 2021

(54) METHOD OF GENERATING TIRE LOAD HISTORIES AND TESTING TIRES

(71) Applicant: Bridgestone Americas Tire Operations, LLC, Nashville, TN (US)

(72) Inventors: Ke Jun Xie, Copley, OH (US); Erik F. Knuth, Hudson, OH (US); David O. Stalnaker, Brentwood, TN (US); John L. Turner, Tucson, AZ (US)

(73) Assignee: Bridgestone Americas Tire Operations, LLC, Nashville, TN (US)

( * ) Notice: Subject to any disclaimer, the term of this patent is extended or adjusted under 35 U.S.C. 154(b) by 492 days.

(21) Appl. No.: 15/744,133

(22) PCT Filed: Jul. 13, 2016

(86) PCT No.: PCT/US2016/041963
§ 371 (c)(1),
(2) Date: Jan. 12, 2018

(87) PCT Pub. No.: WO2017/011486
PCT Pub. Date: Jan. 19, 2017

(65) Prior Publication Data
US 2018/0201077 A1     Jul. 19, 2018

Related U.S. Application Data

(60) Provisional application No. 62/192,180, filed on Jul. 14, 2015.

(51) Int. Cl.
*B60C 99/00*     (2006.01)
*G06F 30/20*     (2020.01)
*G01M 17/02*     (2006.01)

(52) U.S. Cl.
CPC ......... *B60C 99/006* (2013.01); *G01M 17/022* (2013.01); *G06F 30/20* (2020.01); *B60W 2520/125* (2013.01)

(58) Field of Classification Search
CPC .............. B60C 99/006; G01M 17/022; B60W 2520/125
(Continued)

(56) References Cited

U.S. PATENT DOCUMENTS 4,186,593 A    2/1980 Watanabe
4,741,207 A    5/1988 Spangler
(Continued)

FOREIGN PATENT DOCUMENTS

EP    2267426    12/2010

OTHER PUBLICATIONS

European Search Report; Corresponding European Patent Application No. 16825061; filed May 2, 2018; dated Jan. 10, 2019.
(Continued)

*Primary Examiner* — Thai Q Phan
(74) *Attorney, Agent, or Firm* — Shaun J. Fox; Bryan J. Jaketic

(57) ABSTRACT

A method includes obtaining simulated tire data for a simulated tire, simulated vehicle data for a simulated vehicle, and simulated test course data. The simulated tire data includes data to build a basic tire model. The simulated vehicle data includes data to build a basic vehicle model. The simulated test course data includes position-based course data in a horizontal plane and position-based course data in a vertical direction. The method further includes generating a tire load history from the basic tire model, the basic vehicle model, and the simulated test course data.

14 Claims, 13 Drawing Sheets

(58) Field of Classification Search
USPC .............. 703/5, 8; 702/34; 73/146; 340/447
See application file for complete search history.

(56) References Cited

U.S. PATENT DOCUMENTS

| | | | |
|---|---|---|---|
| 5,065,618 A | 11/1991 | Hodges et al. | |
| 6,513,384 B1 | 2/2003 | Quibel et al. | |
| 6,532,811 B2* | 3/2003 | Turner | G01M 17/02 73/146 |
| 6,741,957 B1 | 5/2004 | Sui et al. | |
| 6,804,998 B2* | 10/2004 | Turner | G01M 17/02 73/146 |
| 7,819,000 B2 | 10/2010 | Iwase | |
| 8,296,080 B2 | 10/2012 | Mancosu et al. | |
| 9,429,018 B2* | 8/2016 | Zachary | F24D 5/04 |
| 2002/0124638 A1* | 9/2002 | Turner | G01N 3/56 73/146 |
| 2002/0134148 A1* | 9/2002 | Turner | G01N 3/56 73/146 |
| 2005/0066719 A1* | 3/2005 | Turner | B60C 11/246 73/146 |
| 2007/0279203 A1* | 12/2007 | Thomas | B60C 23/0472 340/447 |
| 2008/0275682 A1 | 11/2008 | Langer | |
| 2009/0012763 A1* | 1/2009 | Langer | G01M 17/022 703/8 |
| 2009/0120178 A1 | 5/2009 | Iwase | |
| 2015/0057951 A1* | 2/2015 | Stalnaker | B60C 99/006 702/34 |

OTHER PUBLICATIONS

European Search Opinion; Corresponding European Patent Application No. 16825061; filed May 2, 2018; dated Jan. 10, 2019.
Patekh D. et al., Laboratory Tire Wear Simulation Process Using Adams Vehicle Model; SAE Technical Paper Series, Society of Automotive Engineers, Warrendale, PA; vol. 961001; Feb. 1, 1996.
International Preliminary Report on Patentability & Written Opinion of the International Searching Authority; Corresponding PCT Application No. PCT/US2016/041963 filed Jul. 13, 2016; Authorized Officer Simin Baharlou; dated Jan. 16, 2018.

* cited by examiner

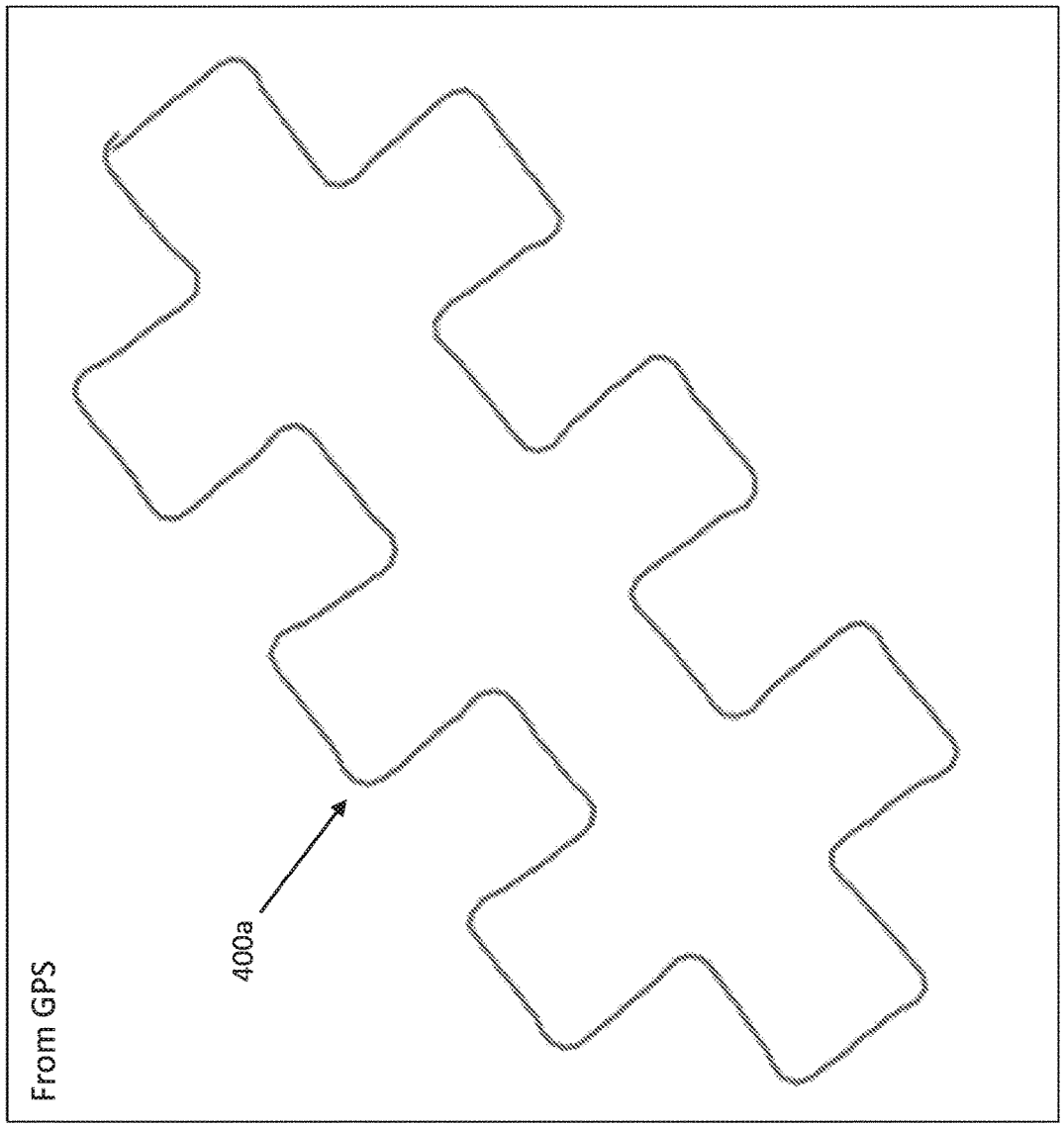

METHOD OF GENERATING TIRE LOAD HISTORIES AND TESTING TIRES

FIELD OF INVENTION

The disclosure generally relates to methods of testing tires. More particularly, this disclosure relates to a method of generating tire load histories to simulate loads on a tire for indoor testing or computer simulation.

BACKGROUND

Automobile and tire manufacturers, among others, test how tires wear. Different methods of wear testing tires are known. In one method, the test tires are placed on a vehicle that is driven. The tires are analyzed after the vehicle is driven a predetermined distance. In another method, a test procedure is performed indoors, on a wear test drum. A wear test drum provides a rotating surface that engages the tire to simulate a road surface. The wear test drum provides mechanisms for varying the force between the tire and the rotating surface. The velocity of the wear test drum's rotating surface may also be varied.

Software programs that simulate the dynamic performance of cars, trucks, motorcycles, and specialty vehicles are known. One such program is CARSIM, produced by Mechanical Simulation Corp., Ann Arbor, Mich. Original equipment manufacturers, suppliers, research labs, vehicle designers, and other entities in the automotive industry use software programs to predict how a simulated vehicle will perform in a performance test.

SUMMARY OF THE INVENTION

In one embodiment, a method for testing a tire includes identifying a vehicle test course including a surface and a predetermined vehicle travel path. The method further includes driving a vehicle along the predetermined vehicle travel path and measuring vehicle accelerations and speed during the driving of the vehicle. The method also includes providing the measured vehicle accelerations and speed to a computer and generating a virtual test course from the measured vehicle accelerations and speed. The method further includes collecting tire performance information from a tire or database, wherein the tire performance information includes at least a force and moment characteristic. The method also includes providing the collected tire performance information to the computer and generating a virtual tire from the collected tire performance information, wherein the virtual tire comprises a first simulated tire. The method further includes providing vehicle attribute information to the computer, wherein the vehicle attribute information comprises a simulated vehicle. The method also includes generating a tire load history based on maneuvering the simulated vehicle through the virtual test course and conducting a tire wear test. The tire wear test includes placing a test tire on a tire wear test machine, starting the tire wear test machine, rotating a tire relative to a wear surface and manipulating the test tire to track the tire load history, stopping the rotation of the wear surface or removing the test tire from the wear surface after a predetermined time interval, and measuring wear on the test tire.

In another embodiment, a method includes obtaining simulated tire data for a simulated tire, simulated vehicle data for a simulated vehicle, and simulated test course data. The simulated tire data includes data to build a basic tire model. The simulated vehicle data includes data to build a basic vehicle model. The simulated test course data includes position-based course data in a horizontal plane and position-based course data in a vertical direction. The method further includes generating a tire load history from the basic tire model, the basic vehicle model, and the simulated test course data.

In yet another embodiment, a method of generating a virtual test course includes obtaining acceleration data and speed data describing a vehicle driven through a test course and processing the acceleration data and the speed data to derive position-based course data in a horizontal plane. The method also includes processing the acceleration data, the speed data, and a distance travelled in a given step to derive position-based course data in a vertical direction, and producing a virtual test course based on the position-based course data in the horizontal plane and the position-based course data in the vertical direction.

BRIEF DESCRIPTION OF THE DRAWINGS

In the accompanying drawings, structures are illustrated that, together with the detailed description provided below, describe exemplary embodiments of the claimed invention. Like elements are identified with the same reference numerals. It should be understood that elements shown as a single component may be replaced with multiple components, and elements shown as multiple components may be replaced with a single component. The drawings are not to scale and the proportion of certain elements may be exaggerated for the purpose of illustration.

FIG. 4a is a two dimensional model of an exemplary closed-loop course based on data from a global positioning system;

DETAILED DESCRIPTION

Figure 1:
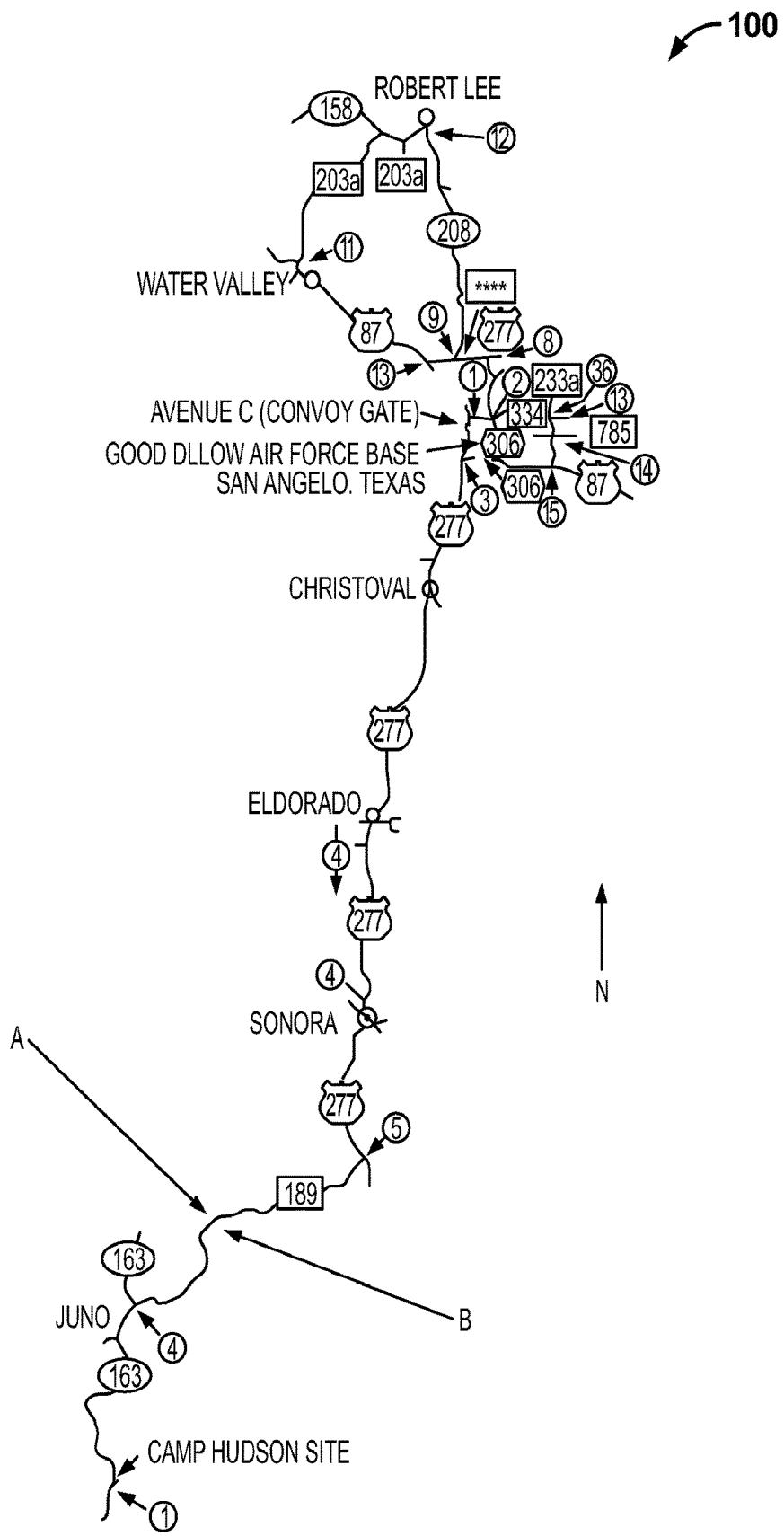
FIG. 1 is a representation of a bird's-eye view of an exemplary vehicle test course.

In one embodiment, tires are tested by applying forces that are exerted on the tires when a vehicle drives along a test course. These forces may be referred to as "tire loads."

To accurately simulate the tire loads when a vehicle drives along a test course, a user may first collect data while a physical vehicle drives along the physical test course. While sensors may be employed to directly measure the tire loads of the vehicle, such direct measurement is complex. It is also possible to measure other variables, and derive the tire loads based on information already known about the vehicle, course, and tires. In one embodiment, the tire loads may be derived from a process that involves measuring the speed and accelerations of the vehicle. Such an embodiment is less complex. Because the tire loads are a function of only the road course, the measurements and derivation do not need re-performed for each vehicle.

In one embodiment, the measurements are taken of a passenger vehicle driving along the physical test course. Examples of passenger vehicles include, without limitation, sport-utility vehicles, light trucks, vans, mini-vans, station wagons, sedans, coupes, convertibles, and smart cars. In an alternative embodiment, the vehicle is a truck. Specific examples of types of trucks include, without limitation, medium trucks, heavy trucks, and tractor trailers.

To measure the accelerations and speed of the vehicle, the vehicle is equipped with measurement instruments. The measurement instruments can include, without limitation, accelerometers, altimeters, GPS sensors, inclinometers, measuring hubs, mechanical sensors (such as a wheel vector sensor), microwave sensors, optical sensors, speedometers, and wheel force transducers. In one known embodiment, only an accelerometer and a GPS unit is used. A GPS may be used as a convenient way to obtain vehicle speed data. The measurement instruments may include an accelerometer that is positioned inside of the car. A monopod or other fixation device may be used to maintain the accelerometer in a fixed position and orientation with respect to the car. Alternatively, the accelerometer may be built into a component of the vehicle, such as the dashboard.

The GPS and the accelerometer may be located in a single device. For example, the VBOX by RACELOGIC includes GPS and an accelerometer. Additionally, smart phones and other commercially available devices may be employed as measurement instruments. In an alternative embodiment, a speedometer may be employed to measure the vehicle speed. In an alternative embodiment, the measurement instruments are external to the vehicle.

Data recorded by the measurement instruments during a test run is stored in a memory device located inside the vehicle (not shown). Examples of memory devices include, without limitation, discs, flash drives, hard drives, and mobile phones. In such embodiments, the memory device may be part of the measurement instrument, or may be part of an external computer that is in signal communication with the measurement instrument. In an alternative embodiment, data recorded during a test run is stored in a memory device that is external to the vehicle. In yet another embodiment, data recorded during a test run is wirelessly transferred to an off-site memory storage device located at the test facility (or another remote location).

Once the vehicle is equipped with the measurement instruments, a driver drives the vehicle through a vehicle test course for course characterization. FIG. 1 illustrates a representation of a bird's-eye view of an exemplary vehicle test course. Specific examples of vehicle test courses include, without limitation, the ACUNA test course (located in Acuna, Coahuila, Mexico), the HiQ test course (located in Fort Ashby, W. Va.), and the UTQG test course (located in San Angelo, Tex.). Additional examples of vehicle proving grounds, which could be used for a tire wear test, include, without limitation, the ADAC and CERM routes in Europe and the TTF and VTS routes in Texas. As one of ordinary skill in the art will understand, any public road or proving ground could serve as the vehicle test course. Procedures for outdoor tire tread wear testing are discussed in the U.S. Department of Transportation National Highway Traffic Safety Administration's Procedures for Tire Treadwear Testing.

Once a vehicle test course is selected, a travel path is chosen by selecting where the course will start and end. The travel path may have varying surfaces, including without limitation paved, gravel, dirt, sand, or icy surfaces.

During a test run, a vehicle is driven from point A to point B while measurements are taken. For example, with reference to FIG. 1, during a first portion of the test, the vehicle may be driven north, and during a second portion of the test, the vehicle may be driven south. The distance between point A and point B may be varied. Today, most wear courses are 200-400 mile closed-loop circuits (where point A and point B are the same point), but it should be understood that any distance may be used.

Figure 2A:
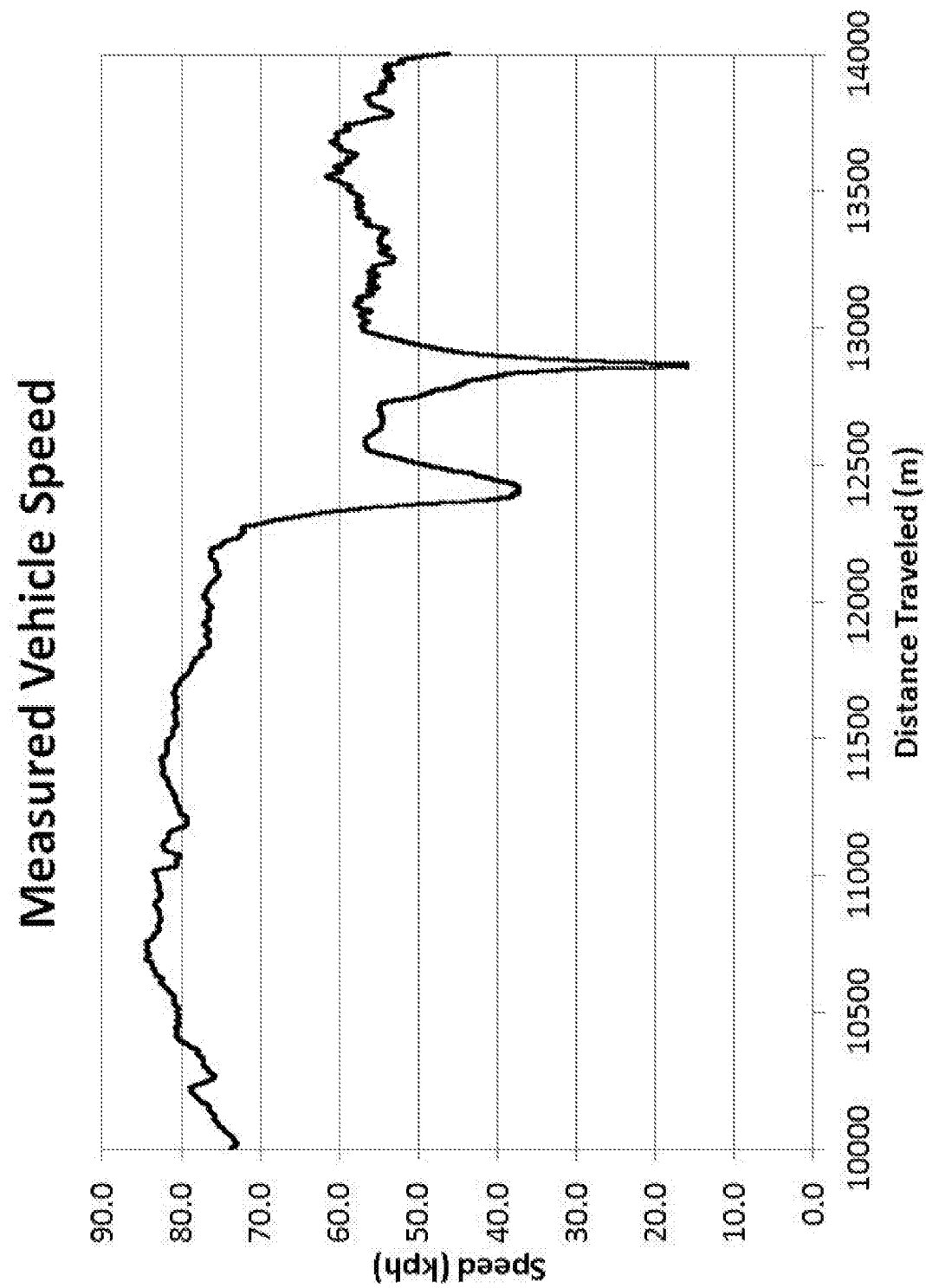
FIG. 2a is an example of a graph showing the speed measured during a test run conducted on a section of an actual vehicle test course.

FIGS. 2a-d are graphs that represent examples of information related to running a vehicle through a 4 km section of an actual vehicle test course. FIG. 2a shows the speed measured during a 4 km section of a test run conducted on an actual vehicle test course. It should be understood that a vehicle may be driven at different speeds during a test run. It should be further understood that multiple test runs may be performed at a variety of speeds.

Figure 2B:
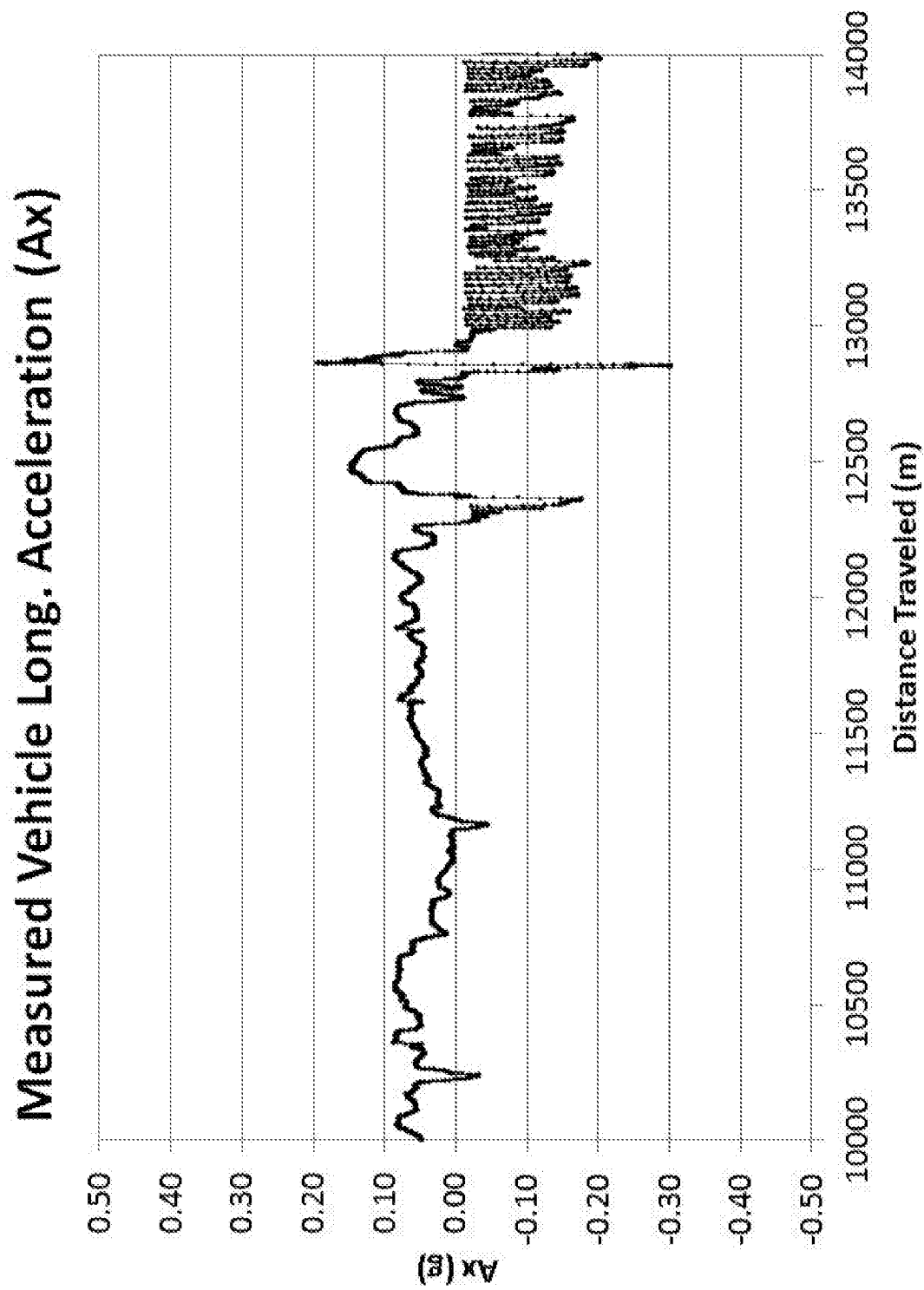
FIG. 2b is an example of a graph showing the longitudinal acceleration measured during a test run conducted on a section of an actual vehicle test course.

FIG. 2b is a graph showing an example of longitudinal acceleration measured during a 4 km section of a test run conducted on an actual vehicle test course. The longitudinal acceleration may be varied to provide results for fast drivers or slow drivers. However, it should be understood that in practice, wear routes may have restrictions on the vehicle speed used on the route.

Figure 2C:
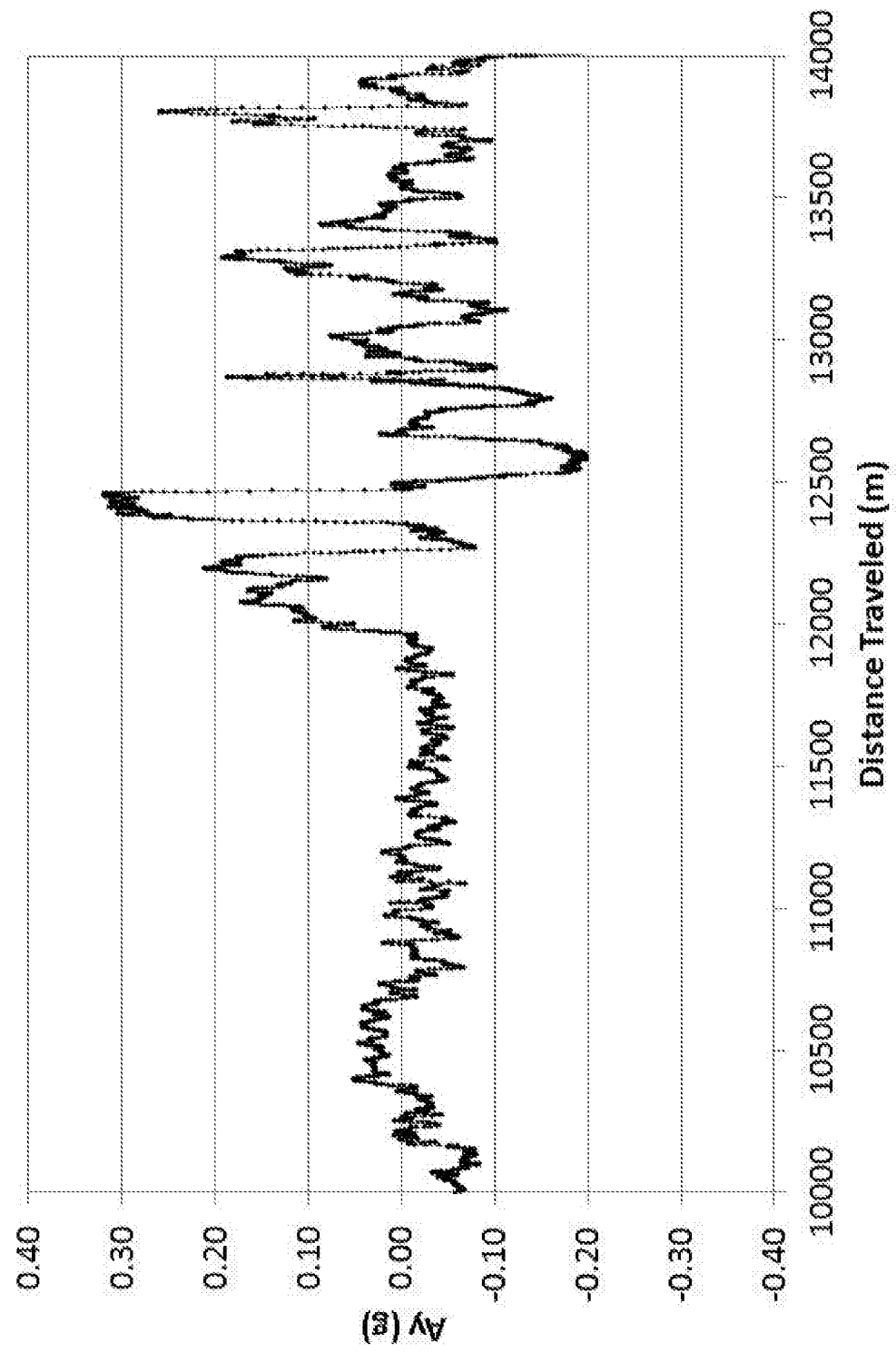
FIG. 2c is an example of a graph showing the lateral acceleration measured during a test run conducted on a section of an actual vehicle test course.

FIG. 2c is a graph showing an example of lateral acceleration measured during a 4 km section of a test run conducted on an actual vehicle test course. The measurements taken with measurement instruments as the vehicle is driven are independent of the vehicle used, as long as the vehicle is driven consistently The vehicle body referenced accelerations may be corrected for the roll and pitch of the vehicle used. The lateral acceleration may be varied to provide results for heavy-cornering drivers or light-cornering drivers. However, it should be understood that in practice, wear routes may have restrictions on the manner in which they are driven.

Figure 2D:
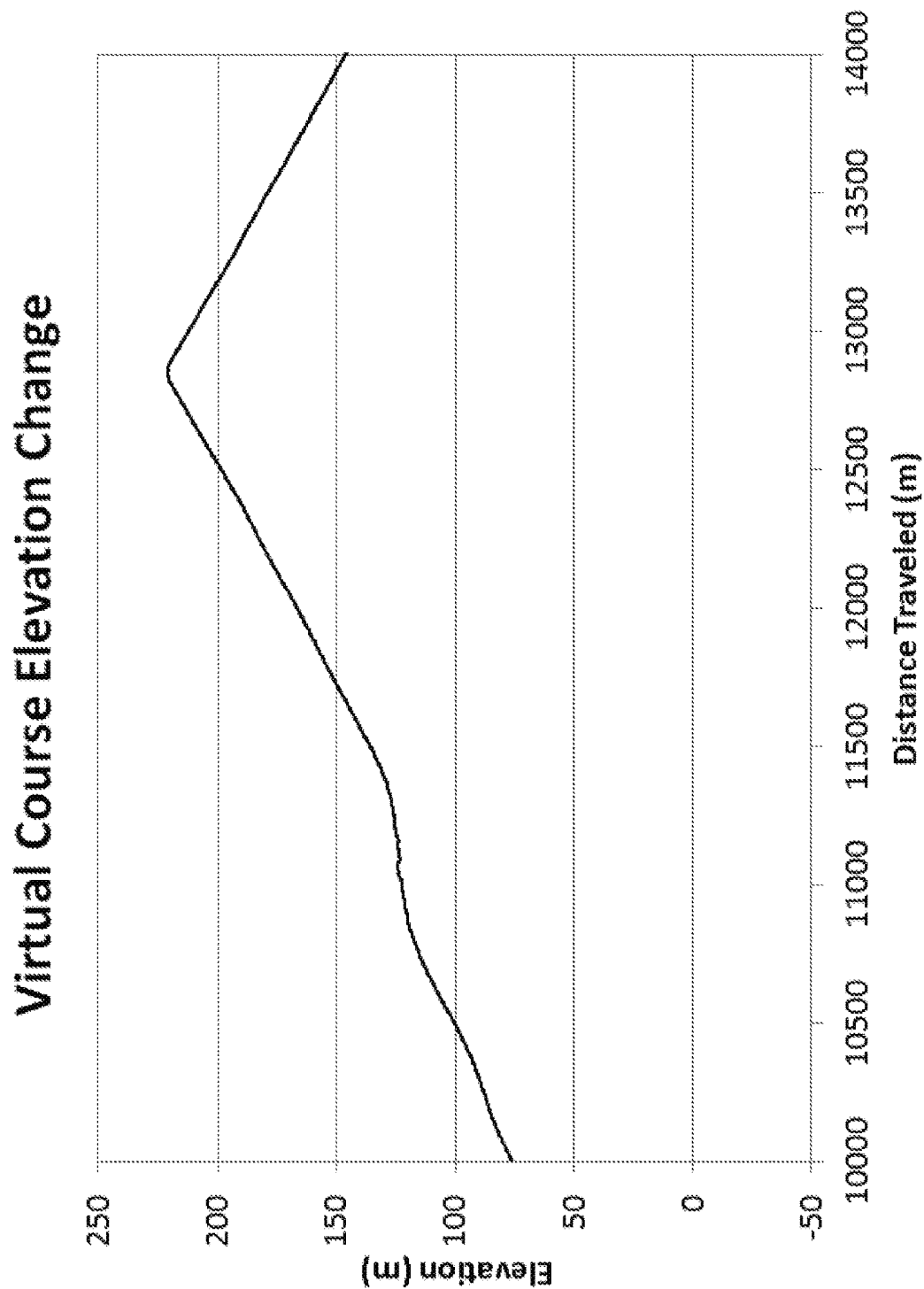
FIG. 2d shows the elevation over a portion of a test run conducted on a section of an actual vehicle test course.

FIG. 2d is a graph showing an example of a change in elevation during a 4 km section of a test run conducted on an actual vehicle test course. The data shown in FIG. 2d may be output from a Virtual Course Generator based on the measured speeds and accelerations.

While GPS alone may be used to derive information about the distances and turns of the vehicle test course 100, it may not account for additional information about the course, such as the elevation, road banking, and road crown. These and other factors alter the tire loads. The measured accelerations and speed may be used in a process to derive the tire loads without the need for taking direct measurements of elevation, road banking, and road crown. Thus, the measured accelerations and speed may be used to characterize the vehicle test course.

Figure 3:
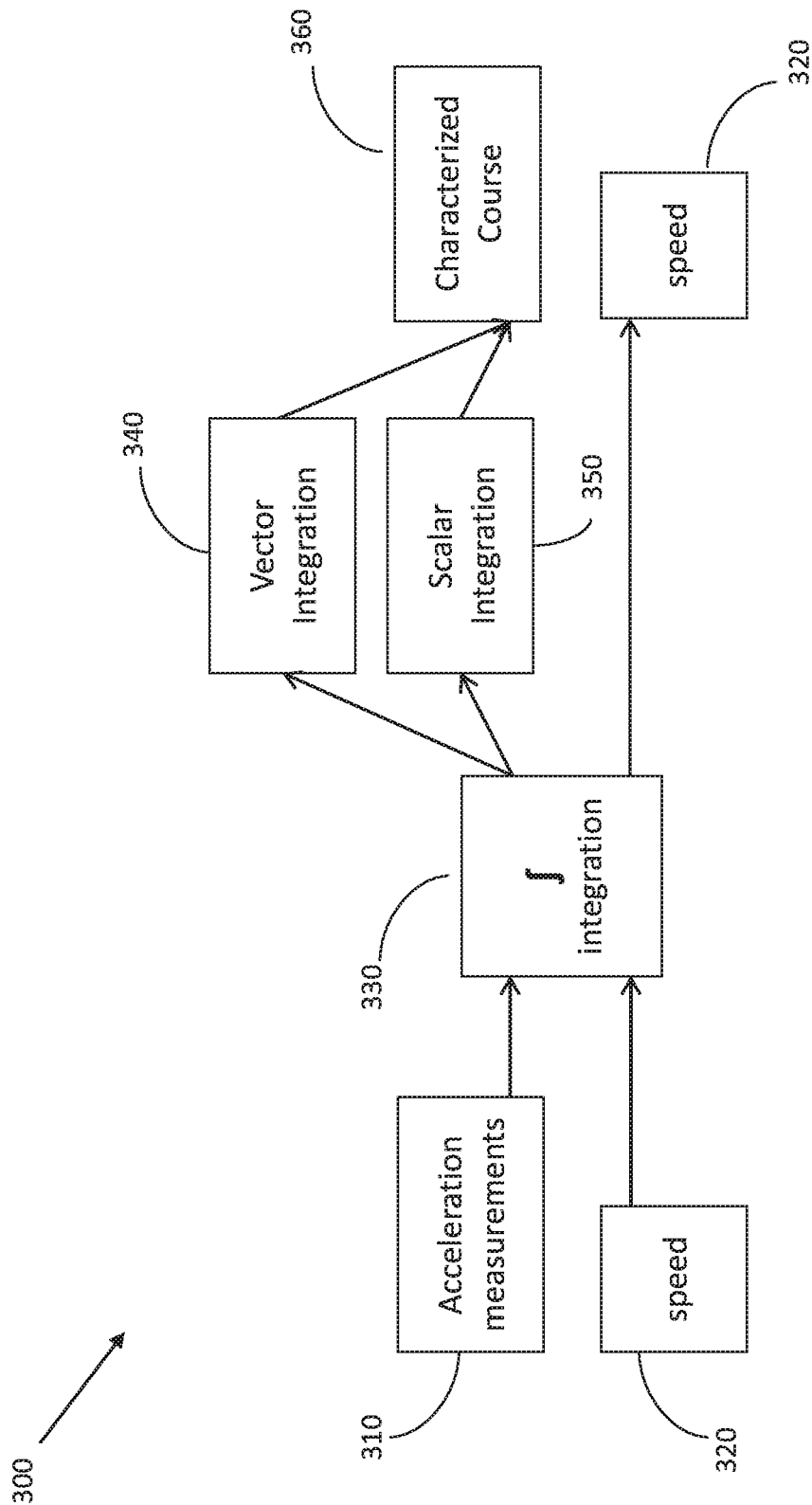
FIG. 3 is a flowchart showing a method of generating a virtual test course.

FIG. 3 is a flowchart describing a method of generating a virtual test course. It should be understood that different steps of this method may be performed by different parties. Acceleration measurements (310) and speed measurements (320) are first obtained during the driving of an actual test course. Such measurements may be obtained through one of the methods described above. The acceleration is measured in both lateral and longitudinal dimensions. In one embodiment, acceleration may also be measure in the vertical dimension. While vertical accelerations are not necessary for all simulations, they may be used to analyze road roughness or other variables.

The speed measurements may optionally be filtered with a low-pass filter (not shown) to remove noise from measurements. The low-pass filter produces filtered speed values capable of replacing the speed data. In one embodiment, a filter between 0.25 and 0.35 Hz is used. In a specific embodiment, a filter of about 0.3 Hz is used. The cutoff frequency of the low-pass filtering may vary from measurement to measurement.

After the speed and acceleration measurements are obtained (and optionally filtered), a computer integrates the data (330). The computer performs vector integration (340) to derive position-based course data in the horizontal plane from the acceleration and speed data. Such position-based course data can be derived even if the position, change in position, and velocity are initially unknown.

The computer also performs scalar integration (350) to derive position-based course data in the vertical direction (elevation) from the acceleration and speed data, as well as from distance travelled in a given step (which may be calculated separately). Such position-based course data can be derived even if the road pitch angle and the change in elevation are initially unknown.

It should be understood that the vector integration (340) and scalar integration (350) may be performed in any order, or may be performed simultaneously. The position-based course data in the horizontal plane and the vertical direction are used to characterize the course (360). The characterized course accounts for more important information at least with respect to tire wear, including, without limitation, road banking and road crown. The output 360 of the virtual test course construction is virtual course data. The virtual course generator outputs data in an x-y-z coordinate system that allows replication of the tire loads during driving.

It should be understood that while the virtual course data may yield an approximation of the tire loads that result from the actual test course, the virtual course may not actually resemble the actual test course geometrically. For example, FIG. 4a is a two dimensional model 400a of an actual closed-loop course. The model 400 is based on GPS data, and fairly represents a bird's eye view of the actual test course that it is based upon.

Figure 4B:
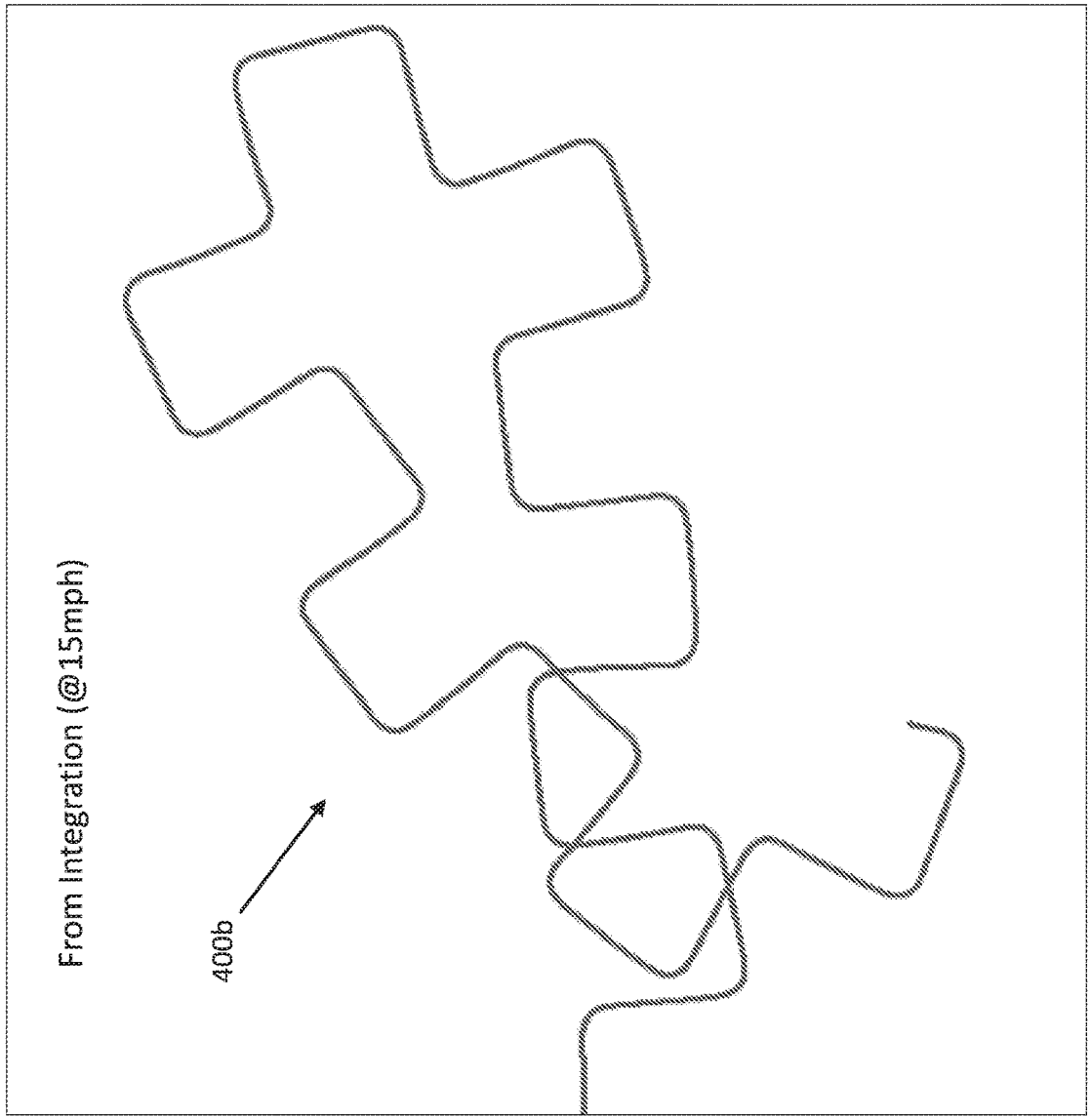
FIG. 4b is a two dimensional model of the exemplary closed-loop course of FIG. 4a, based on an output of a virtual test course construction.

By contrast, FIG. 4b illustrates a two dimensional model 400b of the same exemplary closed-loop course of 400a shown in FIG. 4a, as output by the virtual course generator using the methods previously described. The two dimensional model 400b does not resemble a bird's eye view of the actual test course 400a that it is characterizing, primarily due to road crown and banking. These can have a significant influence on the tire loads, especially in the lateral direction. Therefore, a vehicle travelling along the flat, two dimensional course shown in FIG. 4b would experience the same accelerations and the same forces as the vehicle that traveled along the actual test course (including its real-world banking and road crowns) at the same speed.

For example, while a bird's eye view of an actual test course might appear to be a 90° degree turn, the turn might be banked and it might take place on a downhill or uphill grade. Additionally, the road may be crowned. To replicate the same forces on the vehicle on the actual test course, the characterized path may have to be greater or less than 90°.

Figure 5:
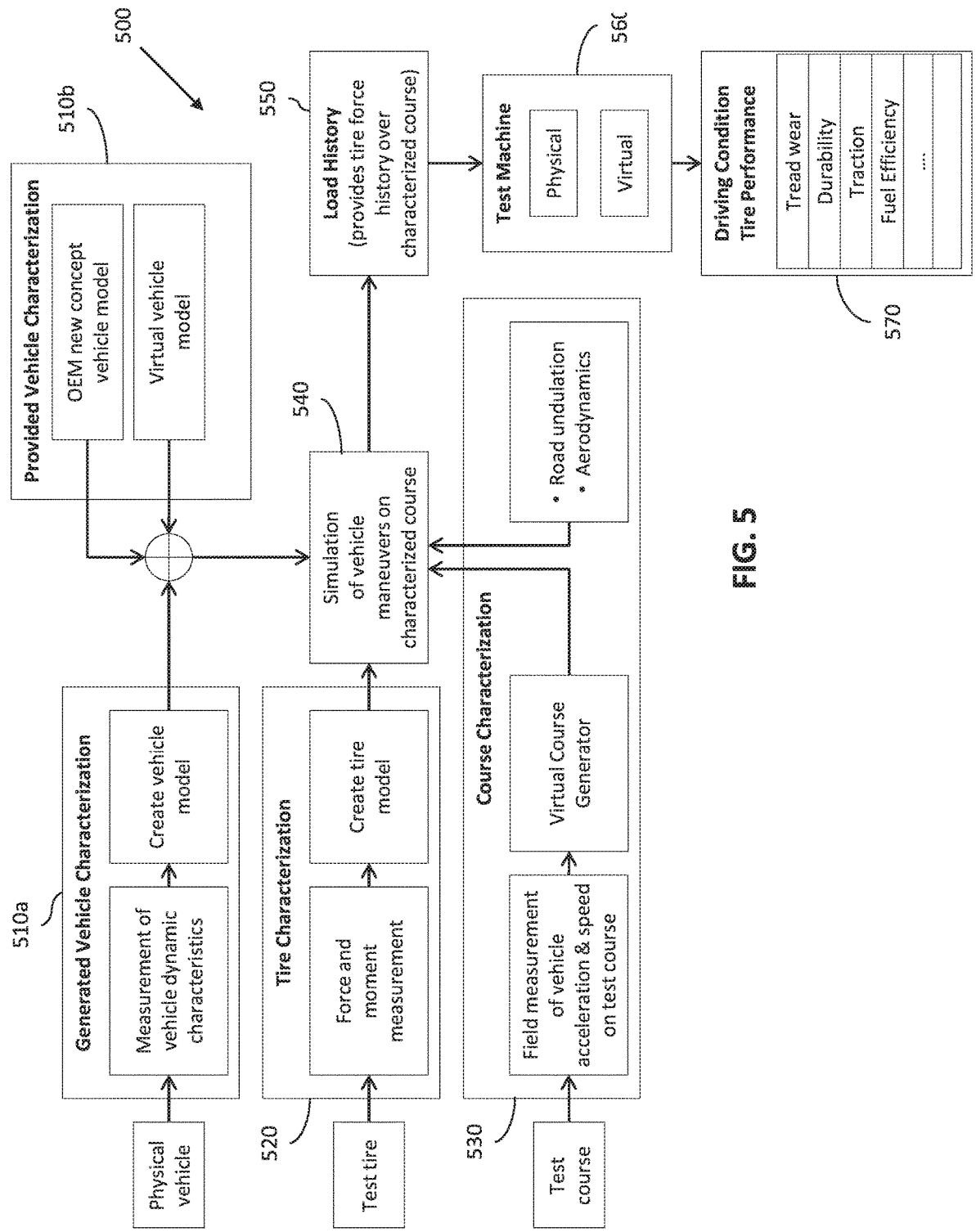
FIG. 5 is a flowchart showing a method for generating a load history.

FIG. 5 shows a flowchart of a method 500 for generating a load history. In the illustrated embodiment, the load history is generated based on a characterization of a specific vehicle (510), a characterization of a specific tire (520), and a characterization of a specific test course (530).

In the illustrated embodiment, the vehicle characterization may be obtained multiple ways. First, a vehicle characterization may be generated (510a) by obtaining attributes of a physical vehicle. Vehicle attribute information may be obtained from an actual vehicle by utilizing measurement instruments as the vehicle is subjected to various tests. Once obtained, the vehicle attribute information can be used to construct a vehicle model.

With continued reference to FIG. 5, the vehicle characterization may also be obtained from an existing source (510b). For example, a model may be provided of an existing passenger vehicle (e.g., the 2013 Chevrolet Cruze or 2013 Chevrolet Silverado). Additionally, a model may be provided by an original equipment manufacturer ("OEM") of an actually-constructed concept vehicle (e.g., the Chevrolet Stingray Concept, Chevrolet Trax Concept, or Chevrolet Express Concept). An existing model of a virtual concept vehicle may also be provided. Such models may be provided in a library, or may be provided by a third party such as a vehicle manufacturer. As one of ordinary skill in the art will understand, a simulated vehicle is not limited to a certain make or model, and any vehicle designer can create a simulated vehicle.

Regardless of whether a vehicle characterization is generated or otherwise provided, the information utilized to construct a simulated vehicle can include, without limitation: wheel base, wheel track, sprung and un-sprung mass, corner weights, center of gravity, suspension compliance, suspension kinematics, wheel alignment, auxiliary roll stiffness, steering kinematics, front-to-rear brake proportioning, front-to-rear torque distribution, tire load and moment characteristics, and aerodynamic drag. As one of ordinary skill in the art will understand, there are as many as approximately 50 different kinematic, compliance, and dimensional parameters that can be utilized to construct a simulated vehicle. Some computer programs, such as CARSIM, can also accommodate mixed virtual vehicles, which incorporate characteristics from multiple vehicles. For instance, a vehicle body can be used from a first vehicle, a suspension can be used from a second vehicle, and a steering curve can be used from a third vehicle. Further, some computer programs can also accommodate averaged virtual vehicles, which represent different size vehicles within a given vehicle class. Engine and regeneration braking may also be accounted for.

As further shown in FIG. 5, each of the tires of the vehicle is also characterized (520). In the illustrated embodiment, a test tire is provided and force and moment measurements are taken. The test tire may be a physical tire, and force and moments may be measured on a force and moment measuring machine. Alternatively, the test tire may be a virtual tire, and force and moments may be generated through finite element analysis or other computerized analysis. In an alternative embodiment (not shown), the tire force and moments information may be collected from a tire database. The force and moment measurements are then used to construct a virtual tire model.

Additionally, a test course is characterized (530). The test course may be characterized in the manner described above with reference to FIGS. 1-4. In other words, accelerations and speed are measured as a vehicle is driven along the selected test course, and the measurements are used to generate a virtual course. Additionally, virtual course data may also include course input data such as road undulation, aerodynamic drag, and weather conditions. For example, international roughness index (IRI) is a commonly used indicator of road surface roughness. If the IRI scale of a road is known, the undulation of the surface can be simulated using a composite of sinusoidal waves. Likewise, the aerodynamic drag can be simulated using a wind profile consisting of wind direction and velocity. For vehicles with high lateral areas, such a heavy trucks, this allows more realistic simulation of lateral tire loads. A weather condition, such as temperature, can also be used to account for a change in tire pressure at a given date.

The vehicle characterization, tire characterization, and test course characterization are all provided to a simulator, which simulates the characterized vehicle maneuvering on the characterized course with the characterized tires (540). This simulation provides a load history (550) that is compilation of the tire loads as the vehicle runs through the test course.

The load history may then be used by a test machine (560) to test various tire performances (570). For example, the test machine may test tread wear, durability, traction, rolling resistance, fuel efficiency, or other performance indicators.

In one embodiment, the test machine is a physical device—a tire wear test machine. A wear test is conducted by placing a physical test tire on the tire wear test machine, selecting the appropriate load history, and starting the tire wear test machine. In subsequent steps, the tire is rotated against a wear surface and the test tire is manipulated so that the wear test tracks the tire load information of the load history. After a predetermined time interval, the rotation of the wear surface is stopped or the test tire is removed from the wear surface. Wear is then measured. This process may be repeated as desired to test wear over varying distances.

As one of ordinary skill in the art will appreciate, some of the steps of the method shown in FIG. 5 need not be performed in any particular order.

Figure 6A:
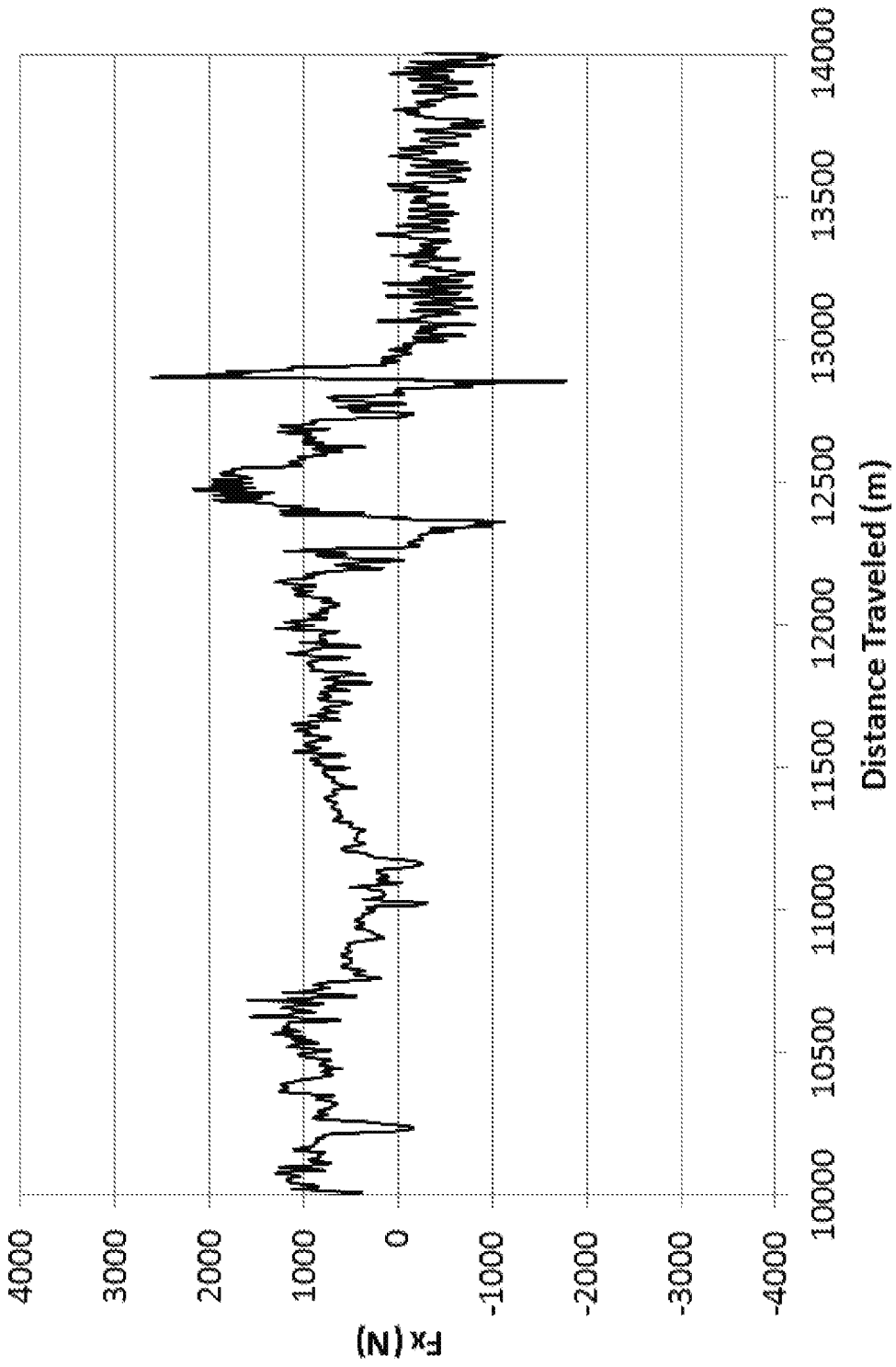
FIGS. 6a-6c show an output of a load history simulator running a model of a vehicle driving a section of a wear course.
Figure 6B:
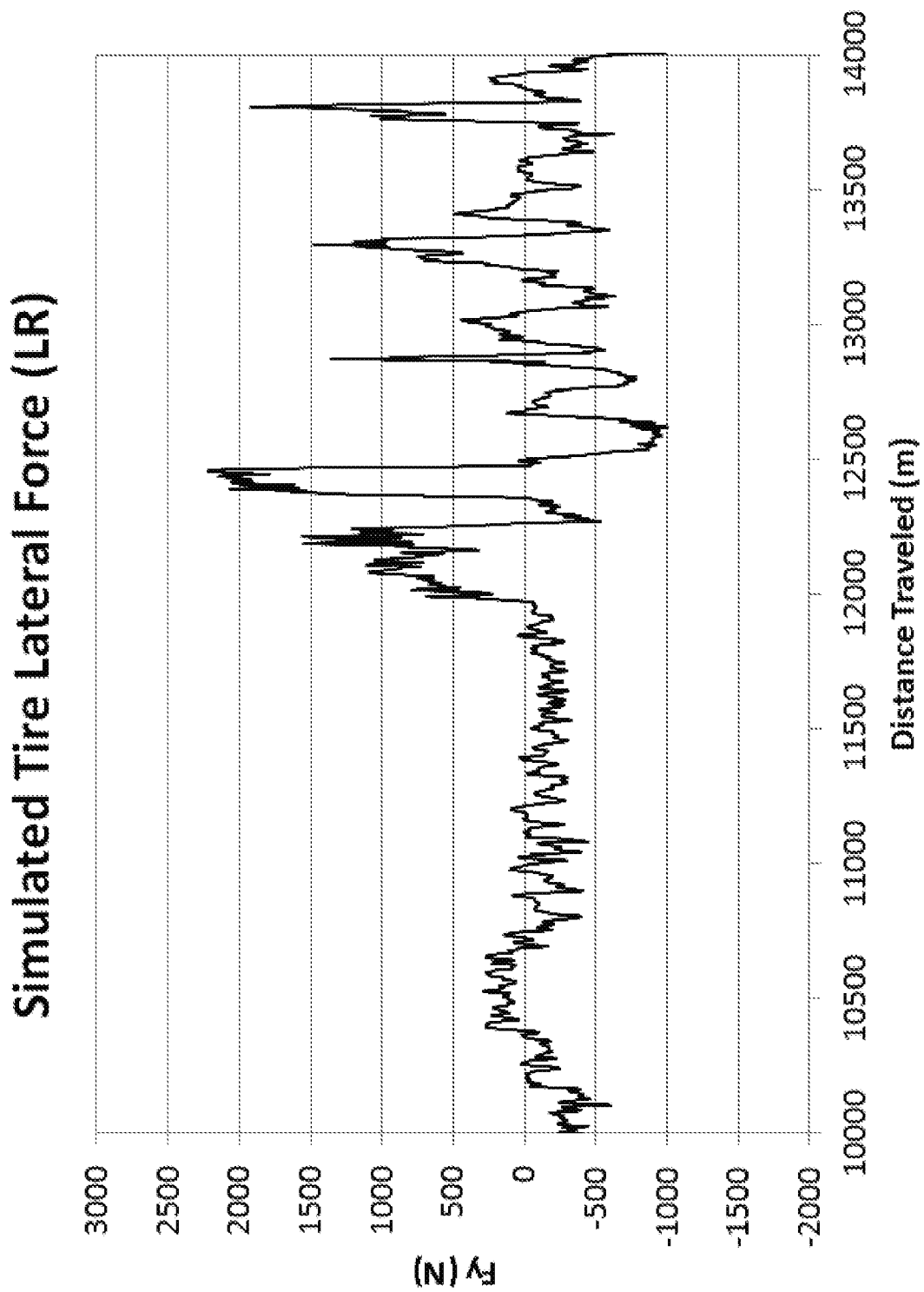
Figure 6C:
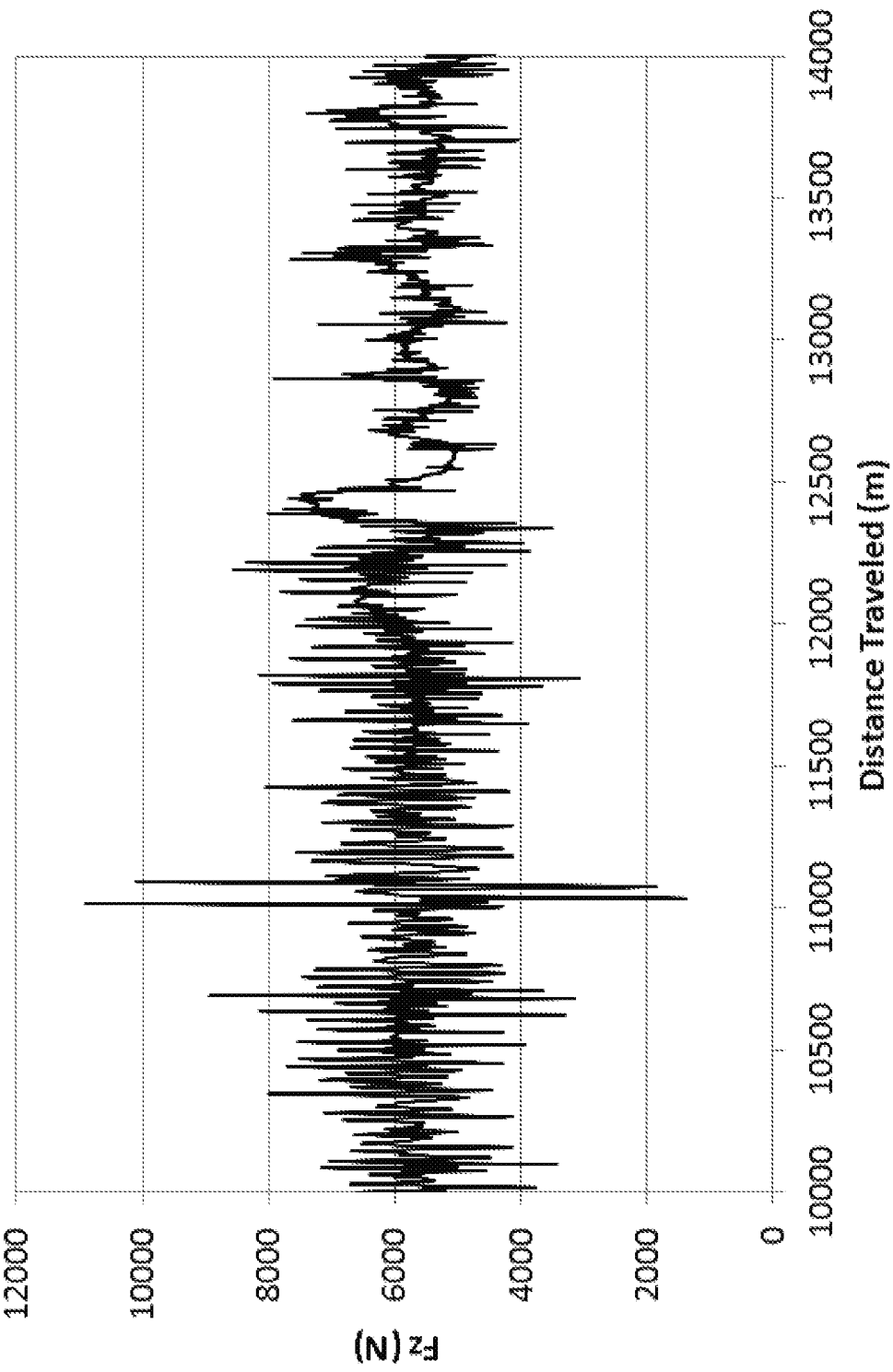

FIGS. 6*a-c* show one output of simulator running a simulation of a vehicle completing a test course. More specifically, FIG. 6*a* shows simulated tire longitudinal force, FIG. 6*b* shows simulated tire lateral force, and FIG. 6*c* shows simulated tire vertical forces. It should be understood that these forces may be output for each of the tires on the vehicle.

Figure 7:
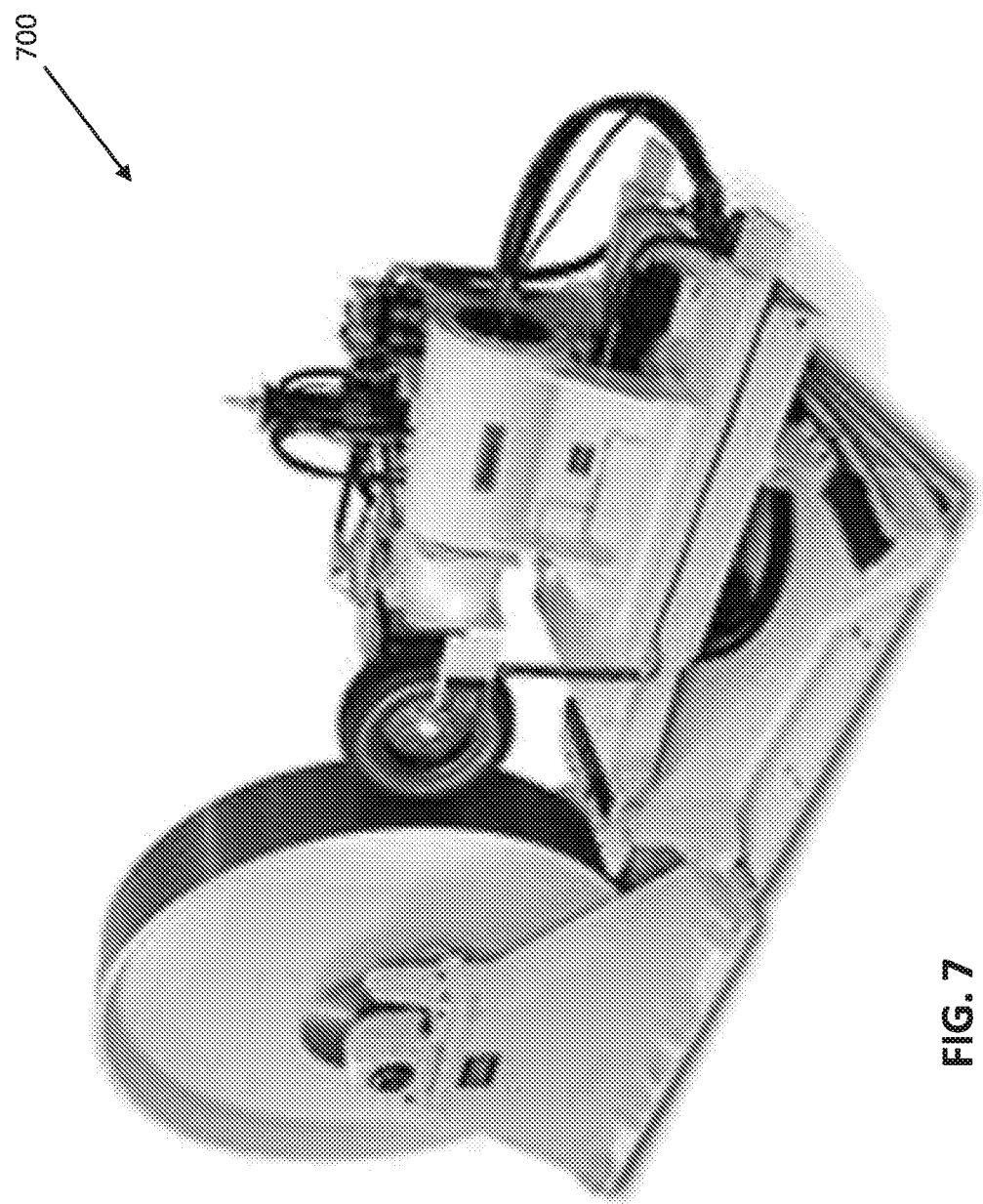
FIG. 7 is a perspective view of a tire test machine.

FIG. 7 is a perspective view of a tire test machine 700. An example of an indoor wear test machines includes, without limitation, the MTS Model 860 RoadWheel Tread Wear Test System. As shown, a test tire is placed in a tire wear test machine. The tire wear test machine may contain an integrated computer, or it may connect to a stand-alone computer. Once the computer is programmed, the wear surface of the machine is rotated so that the tire wear test machine tracks the tire load history through the vehicle test course. Additional equipment may be utilized to maneuver the tire so that the tire wear test machine tracks the tire load history. After the test has run for a predetermined amount of time, the test is paused or stopped. At this time, the test operator may measure the wear on the tire. Once the wear is measured, the test operator may return the tire to the tire wear test machine for additional testing.

To the extent that the term "includes" or "including" is used in the specification or the claims, it is intended to be inclusive in a manner similar to the term "comprising" as that term is interpreted when employed as a transitional word in a claim. Furthermore, to the extent that the term "or" is employed (e.g., A or B) it is intended to mean "A or B or both." When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995). Also, to the extent that the terms "in" or "into" are used in the specification or the claims, it is intended to additionally mean "on" or "onto." Furthermore, to the extent the term "connect" is used in the specification or claims, it is intended to mean not only "directly connected to," but also "indirectly connected to" such as connected through another component or components.

While the present disclosure has been illustrated by the description of embodiments thereof, and while the embodiments have been described in considerable detail, it is not the intention of the applicants to restrict or in any way limit the scope of the appended claims to such detail. Additional advantages and modifications will readily appear to those skilled in the art. Therefore, the disclosure, in its broader aspects, is not limited to the specific details, the representative apparatus and method, and illustrative examples shown and described. Accordingly, departures may be made from such details without departing from the spirit or scope of the applicant's general inventive concept.

What is claimed is:

1. A method for testing a tire comprising:
   identifying a vehicle test course, the vehicle test course including a surface and a predetermined vehicle travel path;
   driving a vehicle along the predetermined vehicle travel path;
   measuring vehicle accelerations and speed during the driving of the vehicle;
   providing the measured vehicle accelerations and speed to a computer;
   generating a virtual test course from the measured vehicle accelerations and speed;
   collecting tire performance information from a tire or database, wherein the tire performance information includes at least a force and moment characteristic;
   providing the collected tire performance information to the computer;
   generating a virtual tire from the collected tire performance information, wherein the virtual tire comprises a first simulated tire;
   providing vehicle attribute information to the computer, wherein the vehicle attribute information comprises a simulated vehicle;
   generating a tire load history based on maneuvering the simulated vehicle through the virtual test course;
   conducting a tire wear test, the tire wear test comprising:
      placing a test tire on a tire wear test machine,
      starting the tire wear test machine,
      rotating a tire relative to a wear surface and manipulating the test tire to track the tire load history,
      stopping the rotation of the wear surface or removing the test tire from the wear surface after a predetermined time interval, and
      measuring wear on the test tire.

2. The method of claim 1, wherein collecting vehicle test course information further comprises obtaining data pertaining to at least one of road undulation and aerodynamic drag.

3. The method of claim 2, wherein the vehicle test course information is modified to account for a wind profile consisting of wind direction and velocity.

4. The method of claim 1, further comprising processing the measured vehicle accelerations and speed to derive position-based course data in a horizontal plane.

5. The method of claim 1, further comprising processing the measured vehicle accelerations and speed to derive position-based course data in a vertical direction.

6. The method of claim 5, wherein the position-based course data in the horizontal plane includes data relating to banking.

7. The method of claim 5, wherein the position-based course data in the horizontal plane includes data relating to road crowning.

8. One or more hardware memory devices having embodied thereon computer-useable instructions that, when executed, implement a method for effectuating tire testing, the method comprising:
　　obtaining simulated tire data for a simulated tire, wherein the simulated tire data includes data to build a basic tire model;
　　obtaining simulated vehicle data for a simulated vehicle, wherein the simulated vehicle data includes data to build a basic vehicle model;
　　obtaining simulated test course data, wherein the simulated test course data includes position-based course data in a horizontal plane based on measured accelerations and speeds of a vehicle driven on a test course and derived through vector integration, and position-based course data in a vertical direction based on measured accelerations and speeds of a vehicle driven on a test course and derived through scalar integration; and
　　generating a tire load history from the basic tire model, the basic vehicle model, and the simulated test course data.

9. The one or more hardware memory devices of claim 8, wherein the implemented method further comprises utilizing the tire load history in conjunction with a machine to test tire performance.

10. The one or more hardware memory devices of claim 8, wherein the simulated vehicle is selected from the group consisting of automobiles and trucks.

11. A method of generating a virtual test course comprising:
　　obtaining acceleration data and speed data measured from a vehicle driven through a test course;
　　processing the acceleration data and the speed data measured from the vehicle to derive position-based course data in a horizontal plane through vector integration;
　　processing the acceleration data, the speed data, and a distance travelled in a given step to derive position-based course data in a vertical direction through scalar integration; and
　　producing a virtual test course based on the position-based course data in the horizontal plane and the position-based course data in the vertical direction.

12. The method of generating a virtual test course of claim 11, wherein the obtaining acceleration data and speed data describing a vehicle driven through a test course includes selecting a physical test course, providing a physical vehicle, and providing an accelerometer.

13. The method of generating a virtual test course of claim 12, wherein the obtaining acceleration data and speed data describing a vehicle driven through a test course further includes driving the physical vehicle along the physical test course, and taking measurements with the accelerometer.

14. The method of generating a virtual test course of claim 11, wherein the obtaining speed data includes obtaining speed data through a GPS.

* * * * *